US006437430B2

(12) United States Patent
Yamada (10) Patent No.: US 6,437,430 B2
(45) Date of Patent: *Aug. 20, 2002

(54) SEMICONDUCTOR APPARATUS AND FRAME USED FOR FABRICATING THE SAME

(75) Inventor: Shigeru Yamada, Tokyo (JP)

(73) Assignee: Oki Electric Industry Co., Ltd., Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/276,118

(22) Filed: Mar. 25, 1999

(30) Foreign Application Priority Data

Aug. 18, 1998 (JP) ............................................. 10-232127

(51) Int. Cl.⁷ .............................................. H01L 23/495
(52) U.S. Cl. ........................................ 257/668; 257/675
(58) Field of Search ................................ 257/675, 706, 257/717, 778, 666, 668, 669

(56) References Cited

U.S. PATENT DOCUMENTS

| 4,827,376 A | * | 5/1989 | Voss ............................ 361/388 |
| 5,414,299 A | * | 5/1995 | Wang et al. ................ 257/702 |
| 5,677,570 A | * | 10/1997 | Kondoh et al. ............ 257/690 |
| 5,723,899 A | * | 3/1998 | Shin ............................ 257/666 |
| 5,869,887 A | * | 2/1999 | Urushima .................... 257/684 |
| 5,989,940 A | * | 11/1999 | Nakajima .................... 438/127 |

FOREIGN PATENT DOCUMENTS

JP      H8-78574      3/1996

\* cited by examiner

*Primary Examiner*—Phat X. Cao
(74) *Attorney, Agent, or Firm*—Rabin & Berdo, P.C.

(57) ABSTRACT

A semiconductor apparatus includes an insulation tape provided with a device hole therein and a semiconductor chip mounted in the device hole and is provided at a first surface with electrode pads. The apparatus also includes a wiring pattern including leads connected at one ends to the electrode pads; and a heat-radiation member provided on the first surface of the semiconductor chip so that heat generated in the semiconductor chip is radiated outwardly through the heat-radiation member.

23 Claims, 6 Drawing Sheets

FIG. 6

SEMICONDUCTOR APPARATUS AND FRAME USED FOR FABRICATING THE SAME

CROSS REFERENCE TO RELATED APPLICATION

This application claims the priority of application Ser. No. H10-232127, filed Aug. 18, 1998 in Japan, the subject matter of which is incorporated herein by reference.

TECHNICAL FIELD OF THE INVENTION

The present invention relates to a semiconductor apparatus, and more particularly to a heat-radiating mechanism for a semiconductor package.

BACKGROUND OF THE INVENTION

A conventional semiconductor apparatus is described in Japanese Patent Laying Open Kokai No. H6-78574. The conventional semiconductor apparatus includes a package substrate, a semiconductor chip mounted on a surface of the package substrate, an elastic layer and a wiring pattern. The elastic layer is made of an insulating material and is formed to surround the semiconductor chip. A film including the wiring pattern and a base film is formed on the semiconductor chip and the elastic layer. The wiring pattern includes leads connected at one end to the semiconductor chip and at the other end to outer terminals, which are provided on the elastic layer. The semiconductor chip is provided in an opening of the elastic layer, and is molded with resin by a potting process.

In the above described conventional semiconductor apparatus, the semiconductor chip is arranged between the package substrate and the molding resin, so that heat generated in the semiconductor chip is not radiated sufficiently. As a result, the semiconductor chip is over heated, and therefore, performance and reliability of the semiconductor chip may deteriorate.

OBJECTS OF THE INVENTION

Accordingly, an object of the present invention is to provide a semiconductor apparatus in which a semiconductor chip is prevented from overheating.

Another object of the present invention is to provide a frame, used for fabricating a semiconductor apparatus, in which a semiconductor chip is prevented from overheating.

Additional objects, advantages and novel features of the present invention will be set forth in part in the description that follows, and in part will become apparent to those skilled in the art upon examination of the following or may be learned by practice of the invention. The objects and advantages of the invention may be realized and attained by means of the instrumentalities and combinations particularly pointed out in the appended claims.

SUMMARY OF THE INVENTION

According to a first aspect of the present invention, a semiconductor apparatus includes an insulation tape which is provided with a device hole therein; and a semiconductor chip which is mounted in the device hole of the insulation tape, and is provided at a first surface with electrode pads. The semiconductor apparatus also includes a wiring pattern which comprises leads connected at one end to the electrode pads; and a heat-radiation member which is provided on the first surface of the semiconductor chip so that heat generated in the semiconductor chip is radiated outwardly via the heat-radiation member.

According to a second aspect of the present invention, a frame includes an insulation tape which is provided with a device hole, in which a semiconductor chip is mounted; and a wiring pattern which includes leads connected at one end to electrode pads, provided on a first surface of the semiconductor chip. The frame also includes a heat-radiation member which is provided on the first surface of the semiconductor chip so that heat generated in the semiconductor chip is outwardly radiated via the heat-radiation member.

As described above, according to the present invention, heat generated in the semiconductor chip is radiated through the heat-radiation member. As a result, the heat-radiation rate of the semiconductor chip is increased, and therefore, the semiconductor chip is prevented from over heating.

DETAILED DISCLOSURE OF THE INVENTION

Figure 1A:
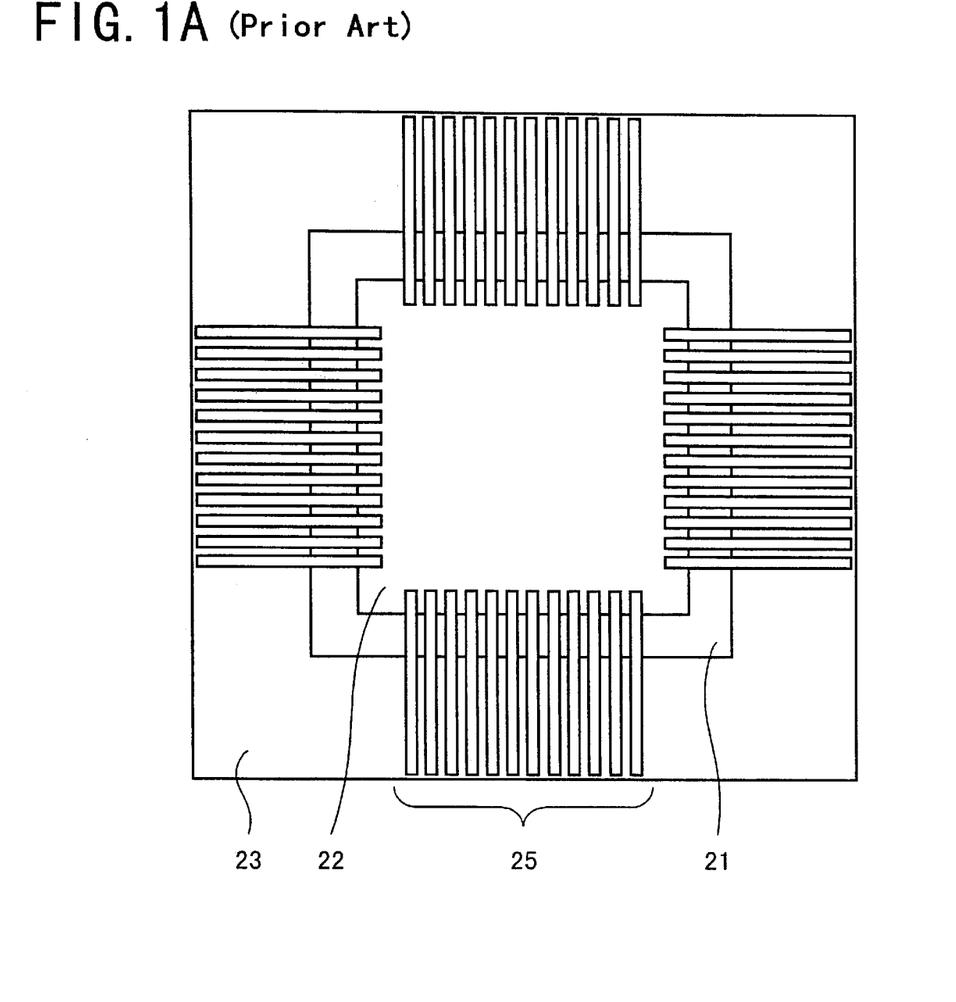
FIG. 1A is a plane view illustrating a conventional semiconductor apparatus in a condition before a resin molding process.
Figure 1B:
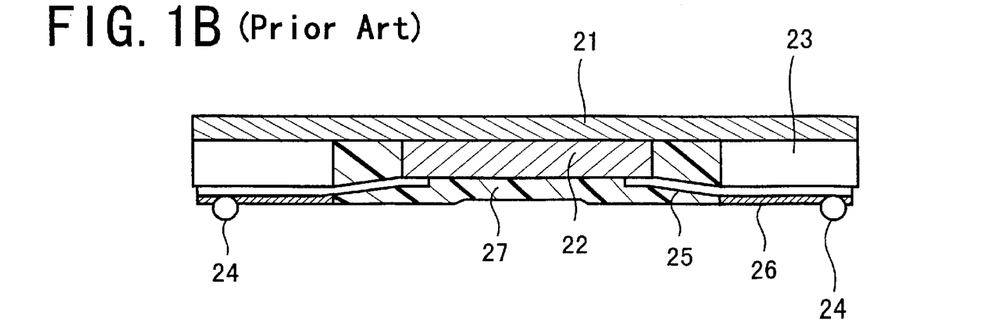
FIG. 1B is a cross-sectional view illustrating the conventional semiconductor apparatus, shown in FIG. 1A, in a condition after the resin molding process.

For better understanding of the present invention, a conventional technology is first described. FIGS. 1A and 1B depict a conventional semiconductor apparatus in conditions before and after a resin molding process, respectively. Such a conventional semiconductor apparatus is described in Japanese Patent Laying Open Kokai No. H6-78574.

The conventional semiconductor apparatus includes a package substrate 21, a semiconductor chip 22, an elastic layer 23 and a wiring pattern 25. The semiconductor chip 22 is mounted on a surface of the package substrate 21. The elastic layer 23 is made of insulating material and is formed to surround the semiconductor chip 22. A film, including the wiring pattern and a base film 26, is formed on the semiconductor chip 22 and the elastic layer 23. The wiring pattern 25 includes leads connected at one end to connecting portions of the semiconductor chip 22 and at the other end to outer terminals 24, which are provided on the elastic layer 23. The base film 26 is shaped to be square to cover the elastic layer 23. The semiconductor chip 22 provided in an opening of the elastic layer 23 is molded with resin 27 using potting equipment.

In the above described conventional semiconductor apparatus, the semiconductor chip 22 is arranged between the package substrate 21 and the molding resin 27, so that heat generated in the semiconductor chip is not radiated sufficiently. As a result, the semiconductor chip 22 is over heated, and therefore, performance and reliability of the semiconductor chip 22 may deteriorate. In general, a semiconductor chip generates much heat at a surface on which electrodes are formed. According to the above mentioned conventional semiconductor apparatus, the surface is covered with the molding resin 27, therefore heat cannot be radiated well. On the other hand, heat generated in the semiconductor chip 22 can be radiated through itself, however, enough heat cannot be transferred to the substrate 21.

Figure 2A:
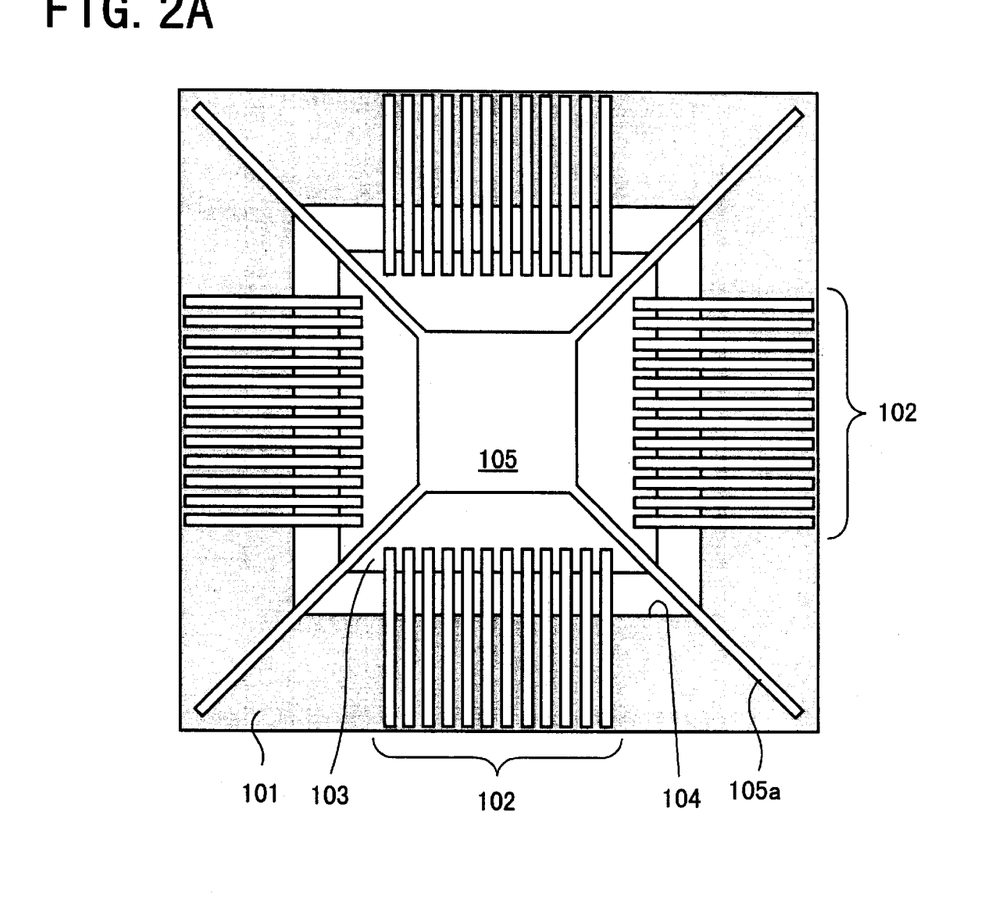
FIG. 2A is a plane view illustrating a semiconductor apparatus, according to a first preferred embodiment of the present invention, in a condition before a resin molding process.
Figure 2B:
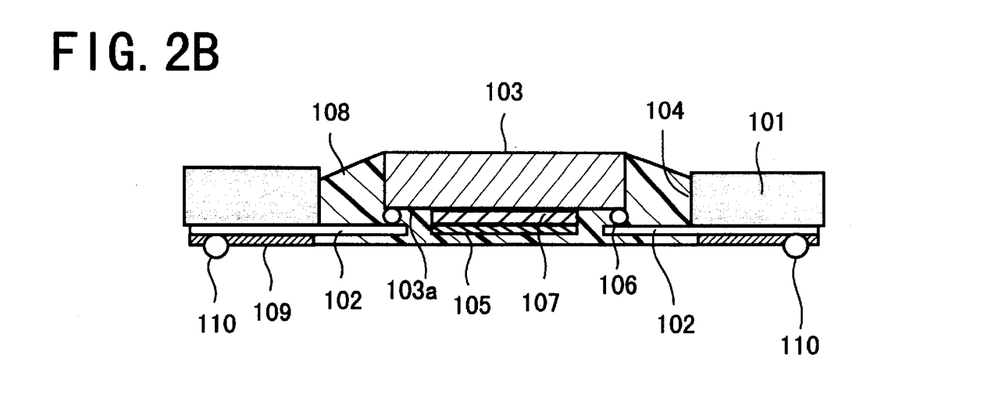
FIG. 2B is a cross-sectional view illustrating the semiconductor apparatus, shown in FIG. 2A, in a condition after the resin molding process.

FIGS. 2A and 2B show a TCP (Tape Carrier Package) type of semiconductor apparatus, according to a first preferred embodiment of the present invention. In this application, TCP means a package fabricated using TAB (Tape Automated Bonding) technology, including a T-BGA (Tape Ball Grid Allay). That is, the invention is applicable to semiconductor apparatus fabricated using a BGA (Ball Grid Allay) technique.

An insulation tape 101 is made of material having an electrical insulation characteristic, such as polyimide, and is shaped to be square. The insulation tape 101 is provided with a device hole 104 in which a semiconductor chip 103 is mounted. The insulation tape 101 is provided at a surface with a wiring pattern 102 made of conductive material, such as copper.

The wiring pattern 102 includes leads extending perpendicular to each side of the device hole 104. Each lead has one end connected, via bumps 106, to electrode pads of the semiconductor chip 103, and another end connected to outer terminals 110.

A heat-radiation pattern 105 is provided on a surface 103a of the semiconductor chip 103 where the electrode pads are arranged on. The heat-radiation pattern 105 is shaped to be square and is in contact with the surface 103a with an adhesive layer 107. The heat-radiation pattern 105 is provided at each corner with a support member 105a, which extends outwardly. Each support member 105a is connected to the insulation tape 101.

The insulation tape 101, the wiring pattern 102 and the heat-radiation pattern 105 form a frame. The wiring pattern 102 and the heat-radiation pattern 105 are made of a conductive material, such as copper. The frame is used for TAB (Tape Automated Bonding). For fabricating the frame, a two-layer structure or a three-layer structure can be used. The two-layer structure includes an insulation tape and a conductive layer. The three-layer structure includes an adhesive layer between the insulation tape and the conductive layer.

When the two-layer structure is applied to the first preferred embodiment of the present invention, a metal layer is formed on an insulation tape by a chemical plating or sputtering technique. Next, a resist layer is patterned on the metal layer by a photolithography technique. Then, the wiring pattern and the heat-radiation pattern of copper are formed by electrolytic plating using the resist layer as a mask.

The room surrounding the semiconductor chip 103 in the device hole 104 is filled up with a molding resin 108. The wiring pattern 102 is covered at the portions extending into the device hole 104 with the molding resin 108. The heat-radiation pattern 105 is also covered with the molding resin 108. An insulating layer 109 is provided at the portions of the wiring pattern 102, that are connected to the insulation tape 101. The insulating layer 109 is not provided at the portions where the outer terminals 110 are connected.

In the above described semiconductor apparatus according to the first preferred embodiment of the present invention, when fabricated, the outer terminals 110 are connected to a wiring pattern of a substrate, not shown. Outer circuitry on the substrate are connected to the inner circuitry of the semiconductor chip 103 via the outer terminals 110, the wiring pattern 102 and the bumps 106.

The semiconductor chip 103 is exposed at the other (upper) surface, so that heat generated in the semiconductor chip 103 is directly radiated from the upper surface, as shown in FIG. 2B. Heat generated in the semiconductor chip 103 is radiated through the heat-radiation pattern 105 to the air and to the substrate. Consequently, heat of the semiconductor chip 103 is well radiated to the outside, and therefore overheating of the semiconductor chip can be prevented.

Figure 3:
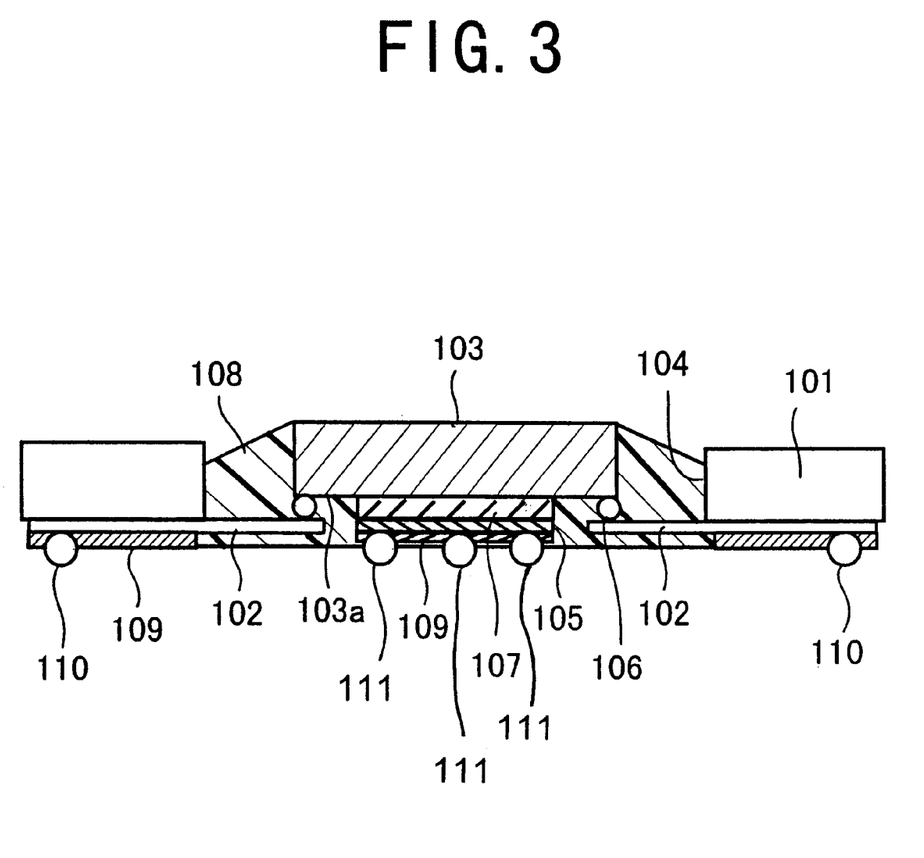
FIG. 3 is a cross-sectional view illustrating a semiconductor apparatus, according to a second preferred embodiment of the present invention.

FIG. 3 shows a semiconductor apparatus according to a second preferred embodiment of the present invention. In FIG. 3, the same or corresponding components of the first preferred embodiment shown in FIGS. 2A and 2B are represented by the same reference numerals; and the same description is not repeated to avoid redundant explanation.

In the semiconductor apparatus according to the second preferred embodiment, shown in FIG. 3, outer terminals 111 are connected to a heat-radiation pattern 105. The heat-radiation pattern 105 is covered at the bottom surface with an insulation layer 109 except for the region where the outer terminals 111 are provided. In mounting a process, the outer terminals 111 are connected to a substrate (not shown) in the same manner as outer terminals 110.

Figure 4A:
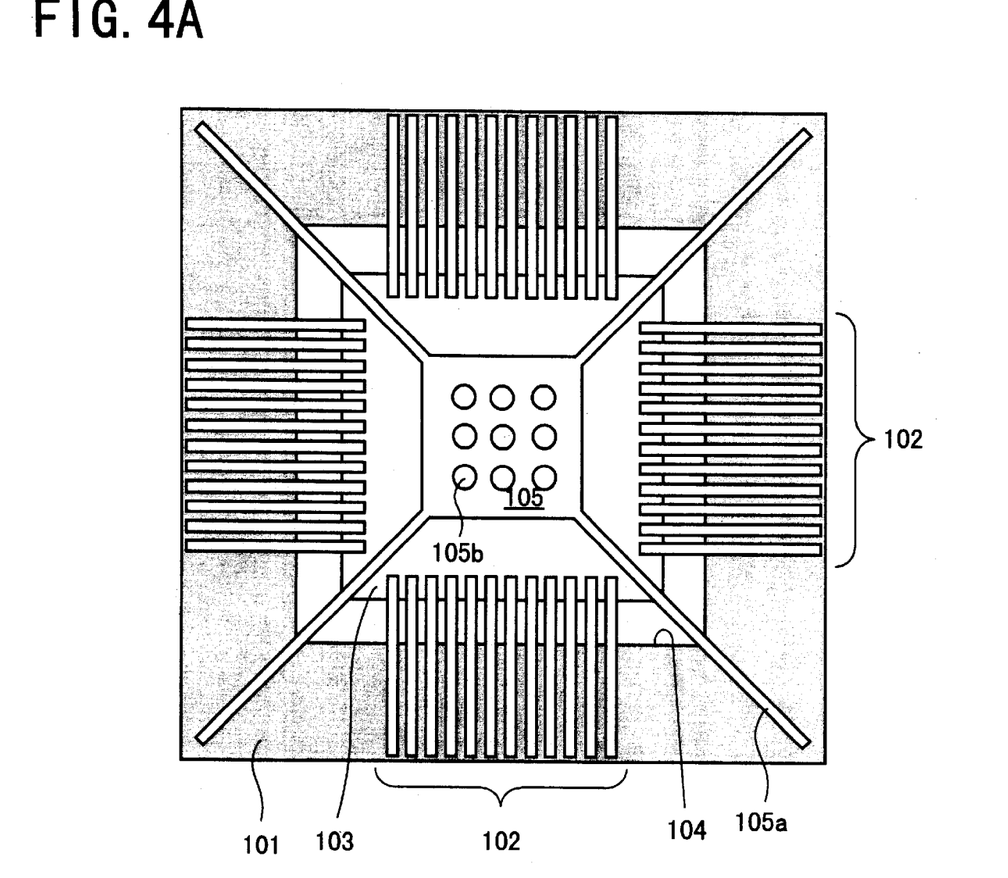
FIG. 4A is a plane view illustrating a semiconductor apparatus, according to a third preferred embodiment of the present invention, in a condition before a resin molding process.
Figure 4B:
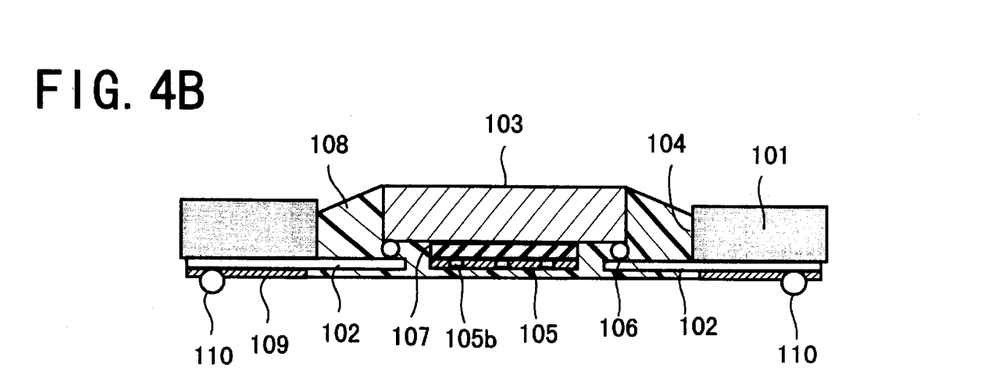
FIG. 4B is a cross-sectional view illustrating the semiconductor apparatus, shown in FIG. 4A, in a condition after the resin molding.

FIGS. 4A and 4B show a semiconductor apparatus according to a third preferred embodiment of the present invention. In FIGS. 4A and 4B, the same or corresponding components of the first and second preferred embodiments, shown in FIGS. 2A, 2B and 3 are represented by the same reference numerals; and the same description is not repeated to avoid redundant explanation.

In the third preferred embodiment, shown in FIGS. 4A and 4B, a heat-radiation pattern 105 is provided with round openings 105b, through which a gas generated from an adhesive layer 107 travels outwardly. As a result, when moisture or water contained in the adhesive layer 107 is gasified by heat of the semiconductor chip 103, the gas is radiated out of the heat-radiation pattern 105. Thus, an undesirable force is not applied between the semiconductor chip 103 and the heat-radiation pattern 105, and therefore, those elements are prevented from being broken by such a force.

Figure 5A:
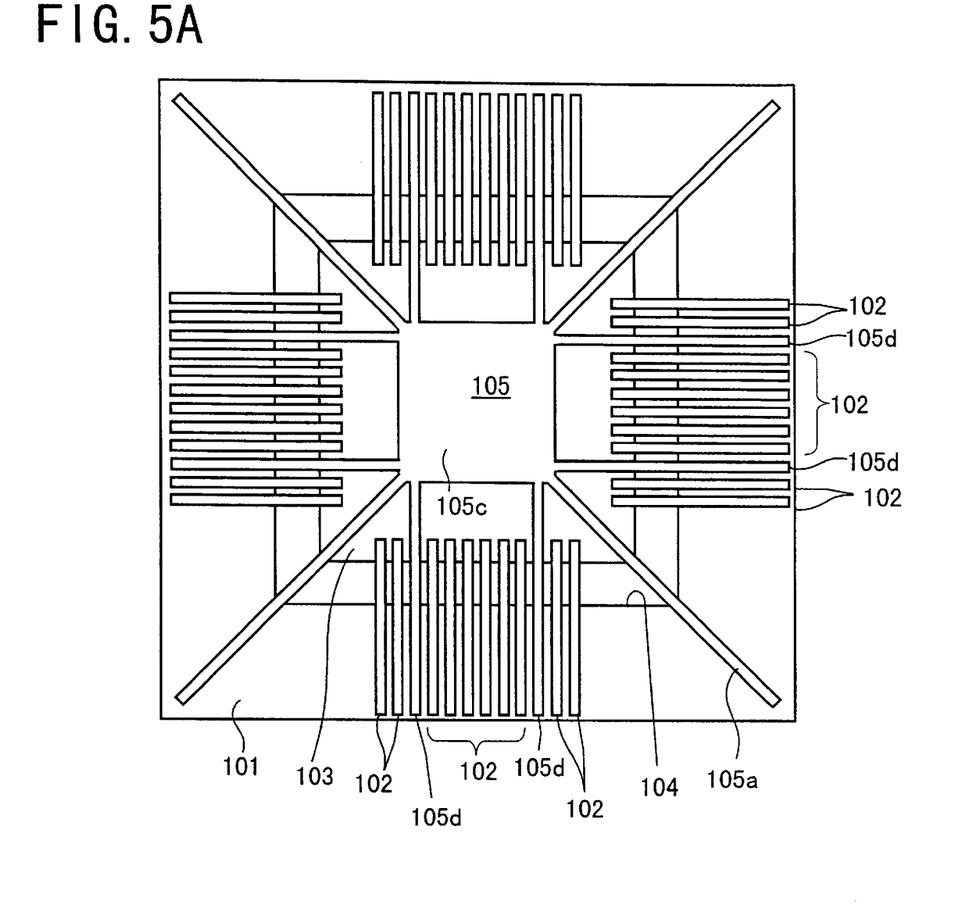
FIG. 5A is a plane view illustrating a semiconductor apparatus, according to a fourth preferred embodiment of the present invention, in a condition before a resin molding process.
Figure 5B:
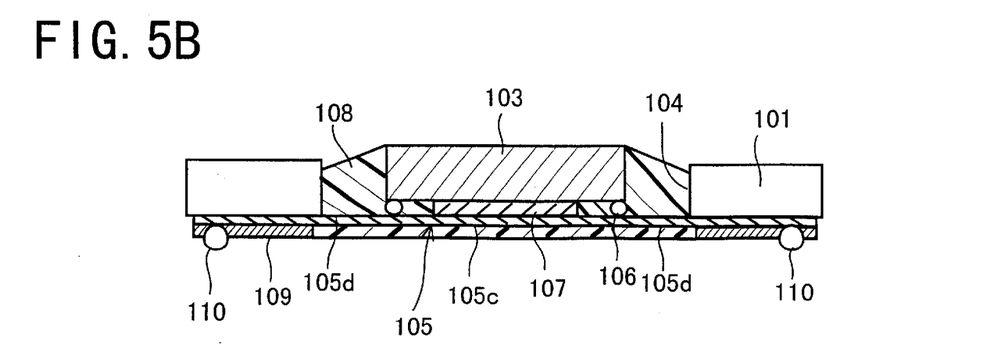
FIG. 5B is a cross-sectional view illustrating the semiconductor apparatus, shown in FIG. 5A, in a condition after the resin molding process.

FIGS. 5A and 5B show a semiconductor apparatus according to a fourth preferred embodiment of the present invention. In FIGS. 5A and 5B, the same or corresponding components of the first to third preferred embodiments, shown in FIGS. 2A, 2B, 3, 4A and 4B are represented by the same reference numerals; and the same description is not repeated to avoid redundant explanation.

In the fourth preferred embodiment, shown in FIGS. 5A and 5B, a heat-radiation pattern 105 includes a radiating portion 105c and connecting portions 105d. The radiating portion 105c is designed to be in contact with the center of a surface 103a of the semiconductor chip 103. The connecting portions 105d extend from the radiating portion 105c outwardly in the same manner as the leads of the wiring pattern 102.

The connecting portions 105d are electrically connected at one end to electrode pads of the semiconductor chip 103 via bumps 106. Preferably, the electrodes of the semiconductor chip 103 connected to the connecting portions 105d are supply electrodes or ground electrodes, which do not change in voltage. If the connecting portions 105d are connected to supply electrodes or ground electrodes of the semiconductor chip 103, the heat-radiation pattern 105 can be used as a common plane, so that the voltage level can be stable. And therefore, margin to outer noise can be increased.

Figure 6:
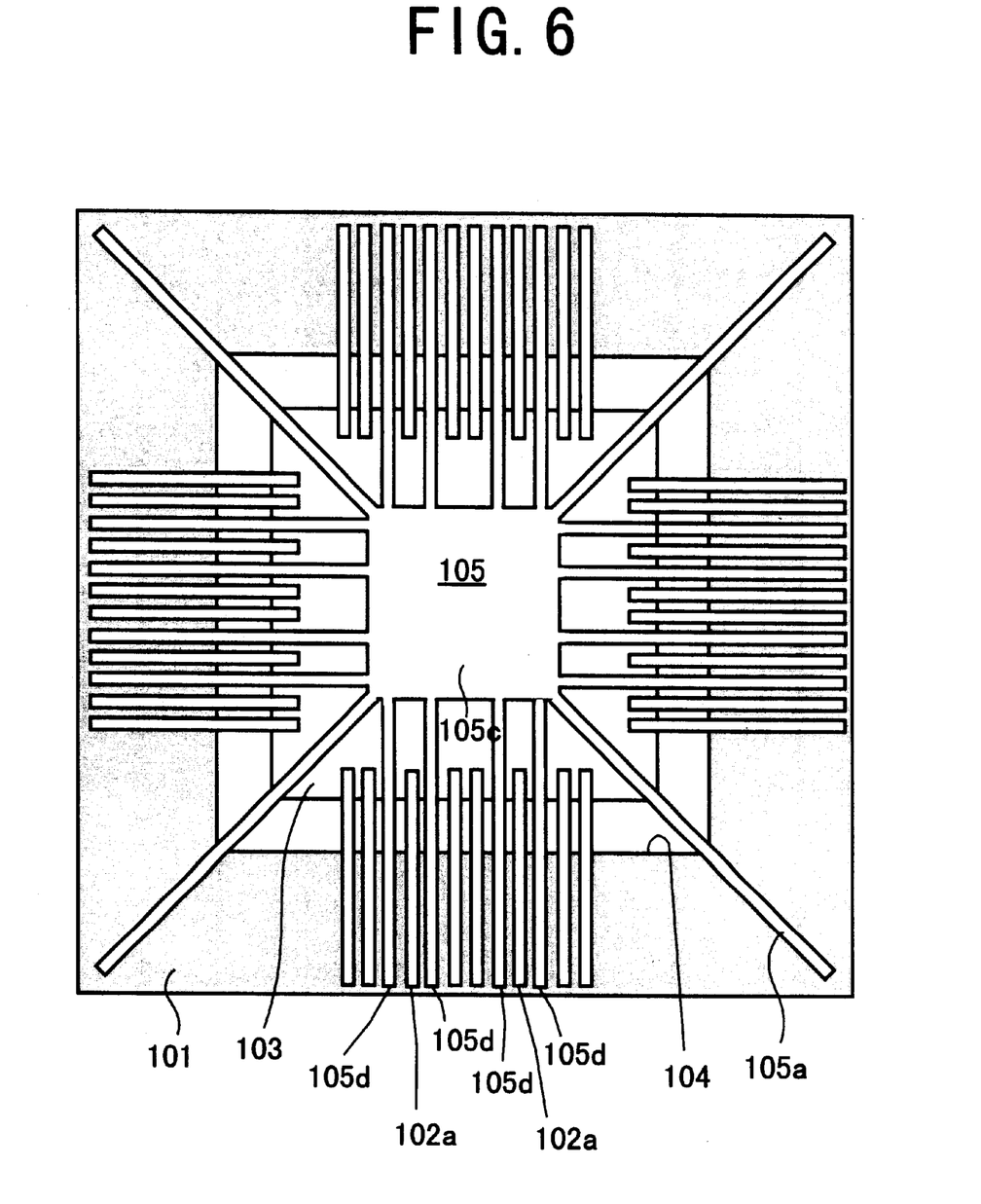
FIG. 6 is a plane view illustrating a semiconductor apparatus according to a fifth preferred embodiment of the present invention.

FIG. 6 shows a semiconductor apparatus according to a fifth preferred embodiment of the present invention. In FIG. 6, the same or corresponding components of the first to fourth preferred embodiments, shown in FIGS. 2A, 2B, 3, 4A, 4B, 5A and 5B are represented by the same reference numerals; and the same description is not repeated to avoid redundant explanation.

In the fifth preferred embodiment, shown in FIG. 6, a heat-radiation pattern 105 includes a radiating portion 105c and connecting portions 105d. Each pair of the connecting portions 105d are arranged at both sides of a micro-stream line (high-speed signal line) 102a in the leads 102. Preferably, the connecting portions 105d are connected to supply electrodes or ground electrodes, so that the connecting portions 105d function as a barrier which prevents cross-influence between the adjacent two signal lines.

What is claimed is:

1. A semiconductor apparatus, comprising:
    an insulation tape having a device hole therein;
    a semiconductor chip in the device hole and provided with a plurality of electrode pads at a first chip surface;
    a plurality of wiring elements formed directly on a surface of the insulating tape, said elements extending substantially straight in parallel to said surface of said insulating tape, each of the elements having an end extending in the device hole and connected to one of the electrode pads via a respective bump;
    a heat-radiation member provided at the first chip surface, said heat-radiation member having a first heat-radiation member surface facing the first chip surface, so that heat generated in the semiconductor chip is radiated outwardly through the heat-radiation member;
    an adhesive member placed between the first chip surface and the first heat-radiation member surface, so as to maintain the first chip surface and first heat-radiation member surface in a face-to-face relation; and
    a molding resin, said resin holding at least the ends of said wiring elements connected to the electrode pads.

2. The semiconductor apparatus, according to claim 1, wherein said heat-radiation member comprises
    a square-shaped radiating portion in contact with the first chip surface; and
    a plurality of support portions extending outwardly from the corners of the radiation portion, each support portion being connected to said insulation tape.

3. The semiconductor apparatus, according to claim 1, wherein said wiring elements and said heat-radiation member are formed of copper.

4. The semiconductor apparatus, according to claim 1, wherein said semiconductor chip has an exposed second chip surface opposite the first chip surface, so that heat generated in said semiconductor chip is also radiated from the second chip surface.

5. The semiconductor apparatus, according to claim 1, further comprising an outer terminal having a first end connected to said heat-radiation member, and a second end connected to a substrate, so that heat generated in said semiconductor chip is directly transferred to the substrate.

6. The semiconductor apparatus, according to claim 1, wherein said heat-radiation member is provided with openings so that a gas generated from said adhesive member is radiated through the openings.

7. The semiconductor apparatus, according to claim 1, wherein the heat-radiation member comprises
    a radiating portion in contact with the first chip surface; and
    a plurality of connecting portions that extend outwardly, each of the connecting portions having an end connected to one of the electrode pads.

8. The semiconductor apparatus, according to claim 7, wherein each connecting portion end is connected to one of a ground electrode and a supply electrode of said semiconductor chip.

9. The semiconductor apparatus, according to claim 7, wherein said wiring elements comprise a micro-stream line, and two of the connecting portions are provided on respective opposite sides of the micro-stream line.

10. The semiconductor apparatus, according to claim 8, wherein said wiring elements comprise a micro-stream line, and two of the connecting portions are provided on respective opposite sides of the micro-stream line.

11. The semiconductor apparatus of claim 1, wherein
    said heat-radiation member and said plurality of wiring elements are made of the same material.

12. A frame used for fabricating a semiconductor apparatus, comprising:
    an insulation tape, having a device hole therein, and for receiving a semiconductor chip having a plurality of electrode pads at a first chip surface;
    a plurality of wiring elements formed directly on a surface of the insulating tape, said elements extending substantially straight in parallel to said surface of said insulating tape, each of said elements having an end extending in the device hole and connected to one of the electrode pads via a respective bump;
    a heat-radiation member having a first heat-radiation member surface;
    an adhesive member, placed on the first heat-radiation member surface, and adapted to adhere the first heat-radiation member surface to the first chip surface so as to maintain the first chip surface facing the first heat-radiation member surface; and
    a molding resin, said resin holding at least the ends of said wiring elements connected to the electrode pads.

13. The frame, according to claim 12, wherein said heat-radiation member comprises
    a square-shaped radiating portion in contact with the first chip surface; and
    a plurality of support portions extending outwardly from the corners of the radiation portion, each support portion being connected to said insulation tape.

14. The frame, according to claim 12, wherein said wiring elements and said heat-radiation member are formed of copper.

15. The frame, according to claim 12, wherein said semiconductor chip has an exposed second chip surface opposite the first chip surface, so that heat generated in the semiconductor chip is also radiated from the second chip surface.

16. The frame, according to claim 12, further comprising an outer terminal having a first end connected to said heat-radiation member, and a second end connected to a substrate, so that heat generated in the semiconductor chip is directly transferred to the substrate.

17. The frame, according to claim 12, wherein said heat-radiation member is provided with openings so that a gas generated from said adhesive member is radiated through the openings.

18. The frame, according to claim 12, wherein said heat-radiation member comprises a radiating portion in contact with the first chip surface; and a plurality of connecting portions that extend outwardly, each connecting portion having an end connected to one of the electrode pads.

19. The frame, according to claim 18, wherein each connecting portion end is connected to one of a ground electrode and a supply electrode of said semiconductor chip.

20. The frame, according to claim 18, wherein said wiring elements comprise a micro-stream line, and two of the connecting portions are provided on respective opposite sides of the micro-stream line.

21. The frame, according to claim 19, wherein said wiring elements comprise a micro-stream line, and two of the connecting portions are provided on respective opposite sides of the micro-stream line.

22. The frame, according to claim 12, wherein said heat-radiation member and said plurality of wiring elements are made of the same material.

23. A semiconductor apparatus, comprising:

an insulation tape having a device hole therein;

a semiconductor chip in the hole and provided with a plural number of electrode pads at a chip surface;

a plurality of electrically conductive bumps, formed, on a one-to-one basis, on the pads;

a plurality of leads formed directly on a surface of the tape, the leads extending, substantially straight without any bends, in parallel to the surface of the tape, from the tape surface into direct contact with the bumps so that each of the leads is electrically connected to one of the pads via a respective one of the bumps;

a heat-radiation member provided at the chip surface, said heat-radiation member having a heat-radiation member surface facing the chip surface, so that heat generated in the chip is radiated outwardly through the heat-radiation member;

an adhesive member placed between the chip surface and the heat-radiation member surface, so as to maintain the chip surface and heat-radiation member surface in a face-to-face relation; and a molding resin, the resin holding at least ends of the leads that are connected to the pads.

* * * * *